(12) United States Patent
Ropp (10) Patent No.: US 9,742,192 B2
(45) Date of Patent: Aug. 22, 2017

(54) METHOD AND SYSTEM FOR ISLAND DETECTION AND ANTI-ISLANDING PROTECTION IN DISTRIBUTED POWER GENERATION SYSTEMS

(71) Applicant: Michael Ropp, Brookings, SD (US)

(72) Inventor: Michael Ropp, Brookings, SD (US)

( * ) Notice: Subject to any disclaimer, the term of this patent is extended or adjusted under 35 U.S.C. 154(b) by 0 days.

(21) Appl. No.: 15/066,703

(22) Filed: Mar. 10, 2016

(65) Prior Publication Data

US 2016/0197479 A1    Jul. 7, 2016

Related U.S. Application Data

(63) Continuation of application No. 13/689,153, filed on Nov. 29, 2012, now Pat. No. 9,287,714.

(60) Provisional application No. 61/565,292, filed on Nov. 30, 2011.

(51) Int. Cl.
*G01R 23/15* (2006.01)
*H02J 3/38* (2006.01)
*H02J 4/00* (2006.01)
*H02J 3/00* (2006.01)

(52) U.S. Cl.
CPC .............. *H02J 3/381* (2013.01); *G01R 23/15* (2013.01); *H02J 3/005* (2013.01); *H02J 4/00* (2013.01); *H02J 2003/388* (2013.01); *Y10T 307/544* (2015.04)

(58) Field of Classification Search
CPC  B60L 2200/26; B60L 5/06; B60L 5/38; H02J 3/381; H02J 4/00; H02J 2003/388; H02J 3/46; H02J 3/06; H02J 3/382; Y10T 307/544; Y02E 10/563; G05F 1/147; G03G 15/6538; G03G 2215/00827; B65H 39/11

USPC ........................ 307/51, 69; 399/403; 209/576
See application file for complete search history.

(56) References Cited

U.S. PATENT DOCUMENTS

| | | | | |
|---|---|---|---|---|
| 6,429,546 | B1 * | 8/2002 | Ropp | H02J 3/01 307/31 |
| 6,728,645 | B1 * | 4/2004 | Kozlov | G01H 13/00 356/28.5 |
| 6,815,932 | B2 * | 11/2004 | Wall | H02J 3/38 290/52 |
| 6,864,595 | B2 * | 3/2005 | Wall | H02J 3/38 290/52 |
| 7,427,815 | B1 * | 9/2008 | Ye | G01R 31/043 307/127 |
| 9,287,714 | B2 * | 3/2016 | Ropp | H02J 4/00 |
| 2002/0060556 | A1 * | 5/2002 | Wall | H02J 3/38 322/29 |

(Continued)

*Primary Examiner* — Thienvu Tran
*Assistant Examiner* — Brian K Baxter
(74) *Attorney, Agent, or Firm* — Patterson Thuente Pedersen, P.A.

(57) ABSTRACT

An effective, yet relatively simple and inexpensive, method for detection of islanding in distributed power generation systems. Statistical analysis of the local line frequency, as measured at the distributed generator, is performed to detect when an island has been formed. The statistical characteristics of the local frequency are controlled by the grid when the distributed generator is not islanding. When an island is formed, however, frequency control switches to circuitry associated with the distributed generator. Because the statistical characteristics of the frequency control performed by the distributed generator are markedly different from those of the grid, the islanding condition can be detected and corrected.

21 Claims, 6 Drawing Sheets

(56) References Cited

U.S. PATENT DOCUMENTS

| | | | | |
|---|---|---|---|---|
| 2004/0088159 A1* | 5/2004 | J. Volponi | G06N 3/02 704/202 |
| 2005/0275979 A1* | 12/2005 | Xu | H02J 3/38 361/20 |
| 2006/0215064 A1* | 9/2006 | Dawson | H03L 7/081 348/730 |
| 2008/0204044 A1* | 8/2008 | Ponnaluri | H02J 3/38 324/647 |
| 2008/0212343 A1* | 9/2008 | Lasseter | H02J 3/30 363/39 |
| 2009/0160260 A1* | 6/2009 | Bright | H02J 3/38 307/87 |
| 2009/0326724 A1* | 12/2009 | Lasseter | H02J 3/382 700/287 |
| 2010/0286838 A1* | 11/2010 | Guzman-Casillas | G01R 19/2513 700/293 |
| 2011/0031810 A1* | 2/2011 | Bright | H02J 3/38 307/51 |
| 2011/0068631 A1* | 3/2011 | Roscoe | H02J 3/38 307/69 |
| 2011/0276192 A1* | 11/2011 | Ropp | H02J 3/383 700/293 |
| 2012/0061961 A1* | 3/2012 | Yasugi | F03D 7/0284 290/44 |
| 2012/0082048 A1* | 4/2012 | Taft | H04L 12/1836 370/252 |
| 2012/0082159 A1* | 4/2012 | Taft | H04L 12/1836 370/390 |
| 2012/0123734 A1* | 5/2012 | Linde | G01R 31/2891 702/150 |
| 2013/0018521 A1* | 1/2013 | Manson | H02J 3/14 700/297 |
| 2013/0107407 A1* | 5/2013 | Pan | H02H 3/305 361/87 |
| 2014/0098449 A1* | 4/2014 | Hellberg | H02J 3/381 361/78 |

\* cited by examiner

METHOD AND SYSTEM FOR ISLAND DETECTION AND ANTI-ISLANDING PROTECTION IN DISTRIBUTED POWER GENERATION SYSTEMS

RELATED APPLICATION

This application is a continuation of application Ser. No. 13/689,153, filed Nov. 29, 2012, entitled METHOD AND SYSTEM FOR ISLAND DETECTION AND ANTI-ISLANDING PROTECTION IN DISTRIBUTED POWER GENERATION SYSTEMS, which claims the benefit of U.S. Provisional Patent Application No. 61/565,292, entitled METHOD AND SYSTEM FOR ISLAND DETECTION AND ANTI-ISLANDING PROTECTION IN DISTRIBUTED POWER GENERATION SYSTEMS, and filed Nov. 30, 2011, each of which is hereby fully incorporated herein by reference.

FIELD OF THE INVENTION

The present invention relates to distributed power generation systems, and more specifically, to detection and correction of unintentional island formation in distributed power generation systems.

BACKGROUND OF THE INVENTION

Distributed power generation, in which relatively small electrical generation sources (sometimes known as distributed energy resources or DERs) that may be primarily intended to serve a specific load are interconnected with a larger-scale electrical power grid to enable sharing of excess power that they generate, is coming into increasing use as a way of facilitating the use of renewable energy resources and improving the overall reliability and efficiency of the power grid. A persistent problem in distributed power generation systems, however, is the hazard to personnel and equipment that occurs when a segment of the grid containing a DER becomes unintentionally disconnected from the remainder of the grid containing the primary central generation source. When a segment is disconnected, the DER may continue to power the disconnected segment, forming an "island." This can endanger personnel who may be working to restore connection of the segment with the grid and may wrongly assume the islanded segment is not energized. Further, voltage or frequency deviations in the islanded segment may damage electrical equipment connected to the segment. For these reasons, industry standards such as IEEE 1547 have been developed that require distributed generators to detect unintentional island formation so that appropriate corrective action can be taken in a timely fashion.

Prior attempts have been made at developing methods for detecting island formation, and have included active, passive, and communications-based methods. None of these prior methods, however, have proven entirely satisfactory. For example, communications-based methods many be ineffective if communications are interrupted before an islanding event occurs. Some of the prior methods rely on complex signal processing techniques, which to be effective, often require the use of expensive, high-powered computational equipment. Other active prior islanding detection methods require the distributed generation system to inject a perturbation with a specific detectable signature. Such methods, however, require specialized equipment to generate, inject, and detect the signature.

What is still needed in the industry is an effective, yet relatively simple and inexpensive method for detection of islanding in distributed power generation systems.

SUMMARY OF THE INVENTION

Embodiments of the present invention address the need in the industry for an effective, yet relatively simple and inexpensive, method for detection of islanding in distributed power generation systems. According to embodiments of the invention, statistical analysis of the local line frequency, as measured at the distributed generator, is performed to detect when an island has been formed. The statistical characteristics of the local frequency are controlled by the grid when the distributed generator is not islanding. When an island is formed, however, frequency control switches to circuitry associated with the distributed generator. Because the statistical characteristics of the frequency control performed by the distributed generator are markedly different from those of the grid, the islanding condition can be detected.

The new passive method of islanding detection according to embodiments of the invention is tentatively named RoCoF-H, which stands for "Rate of Change of Frequency-Histogram." This method involves measuring and recording the histogram of rate of change of frequency (RoCoF, also denoted df/dt), over a selected time period—in other words, the recent history of the rate of change of frequency—and then analyzing the histogram to extract an index value that allows a determination of whether the system is islanded. This value is then used in an anti-islanding decision algorithm to either command disconnection of the DER if an islanding condition is indicated, or to allow the DER to "ride-through" without disconnection if an islanding condition is not indicated.

The above summary is not intended to describe each illustrated embodiment or every implementation of the subject matter hereof. The figures and the detailed description that follow more particularly exemplify various embodiments.

BRIEF DESCRIPTION OF THE FIGURES

Subject matter hereof may be more completely understood in consideration of the following detailed description of various embodiments in connection with the accompanying figures, in which.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Figure 1:
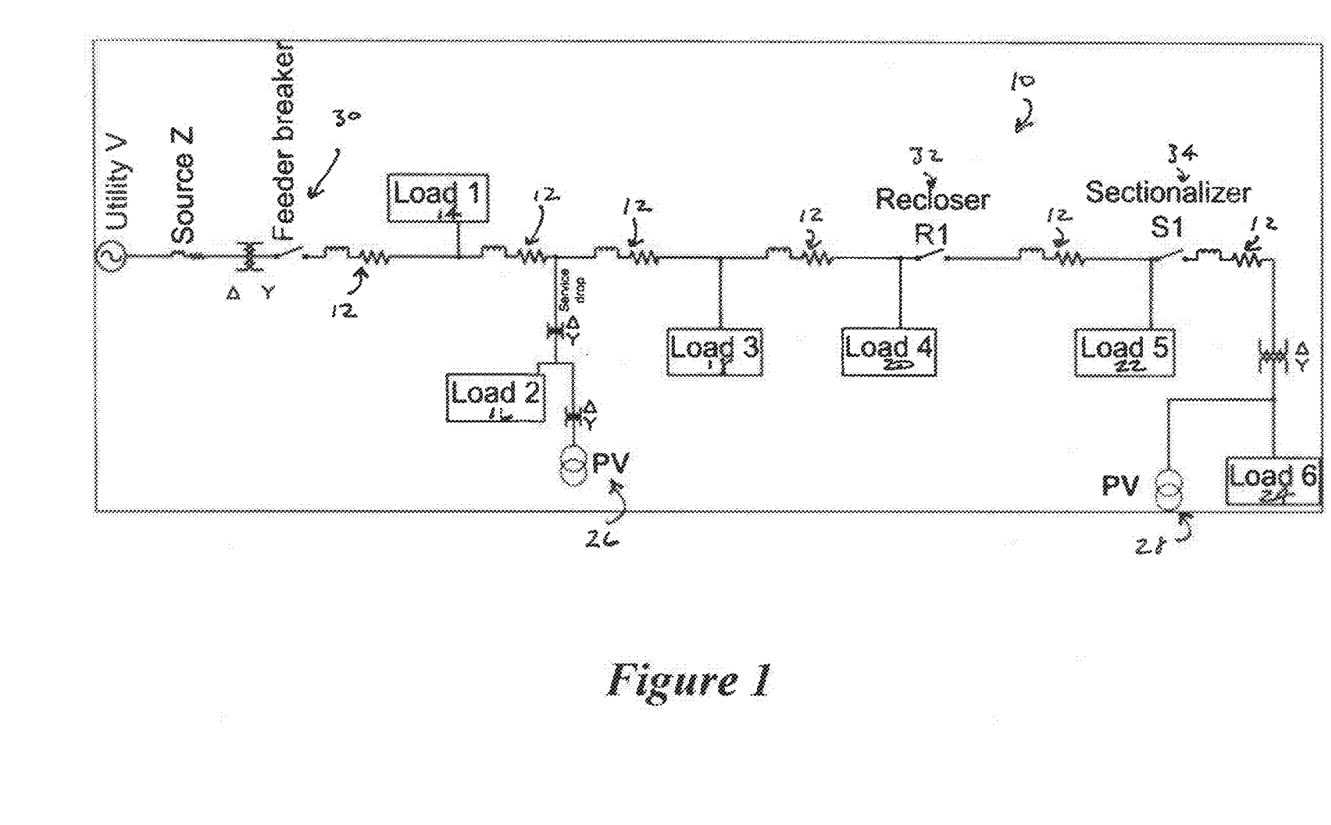
FIG. 1 is a diagrammatic depiction of an exemplary distribution feeder system.

In FIG. 1, there is depicted a diagram of an exemplary distribution feeder 10. Feeder 10 generally includes feeder series impedances 12, load blocks 14, 16, 18, 20, 22, 24, and distributed generators 26, 28, which are in this case, photovoltaic (PV) systems. Voltage source Utility V at the left, along with its source impedance Source Z, represent the grid from the standpoint of feeder 10. When feeder 10 is connected to the grid (i.e. feeder breaker 30, recloser 32, and sectionalizer 34 are all closed), the frequency on feeder 10 is controlled by the grid. The frequency of the grid is determined by the rotational speed of the large main-line generators such as coal, nuclear, hydropower and natural gas-fired plants associated with Utility V. This rotational speed is regulated by governors on these plants. Because of the relatively slow action speed of these governors and the fact that the generators typically have large rotational inertia, the rate of change of frequency when feeder 10 is grid-tied will usually be very slow. When the grid connection of feeder 10 is lost and feeder 10 becomes an island, as may happen for example if feeder breaker 30 opens, the local frequency on feeder 10 is controlled by distributed generators 26, 28. Inverter-based distributed generators, such as PV systems, generally have very fast-acting frequency controls and no rotational inertia. Further, even if distributed generators 26, 28, are powered by engines or other rotating machines, such relatively small engines or machines as are typically used in distributed generation systems have much faster governor control and much lower rotational inertia than the large main-line plants employed to power the grid. Thus, when feeder 10 is islanded, the rate-of-change of the frequency (df/dt) can be expected to shift to a higher range.

Figure 2:
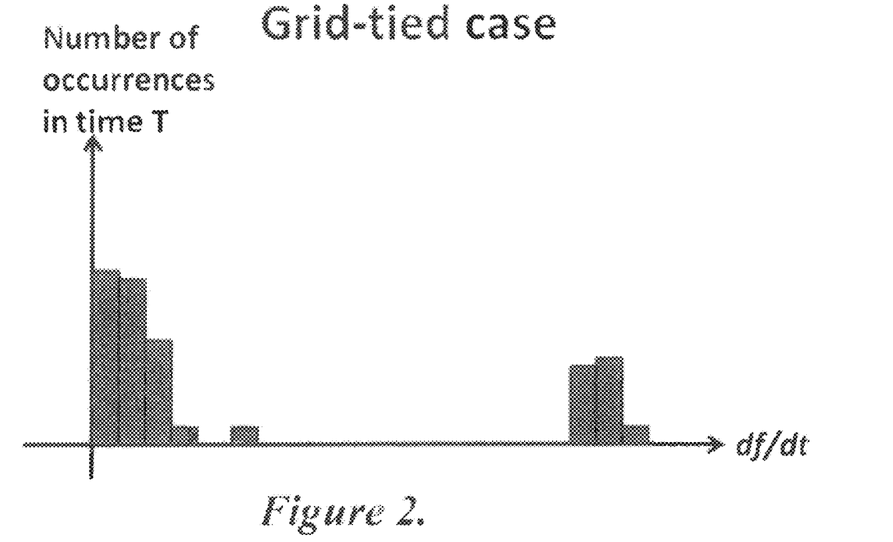
FIG. 2 is an exemplary histogram depiction of the expected distribution of the absolute value of df/dt in a grid-tied distributed generation system.
Figure 5:
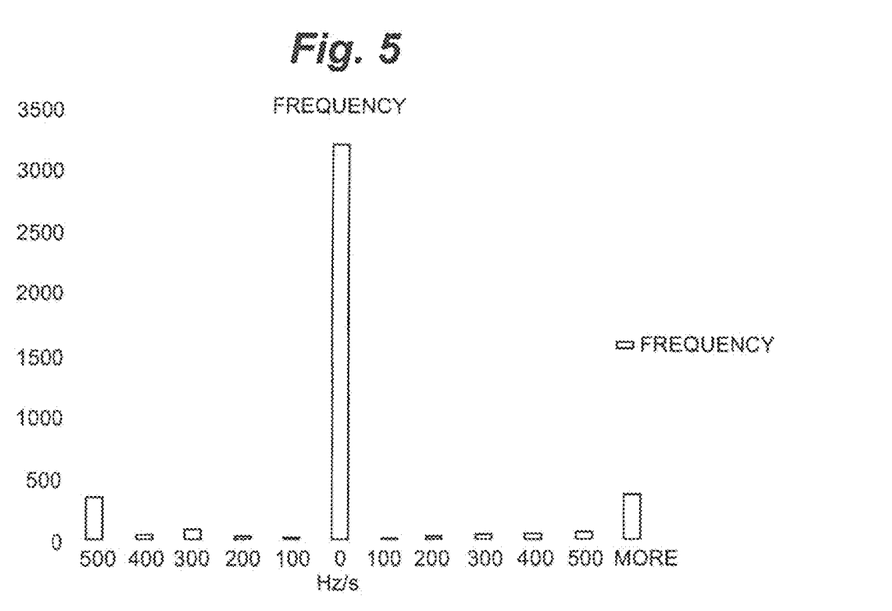
FIG. 5 is a histogram depiction of measured frequency change values in a grid-tied distributed generation system.
Figure 6:
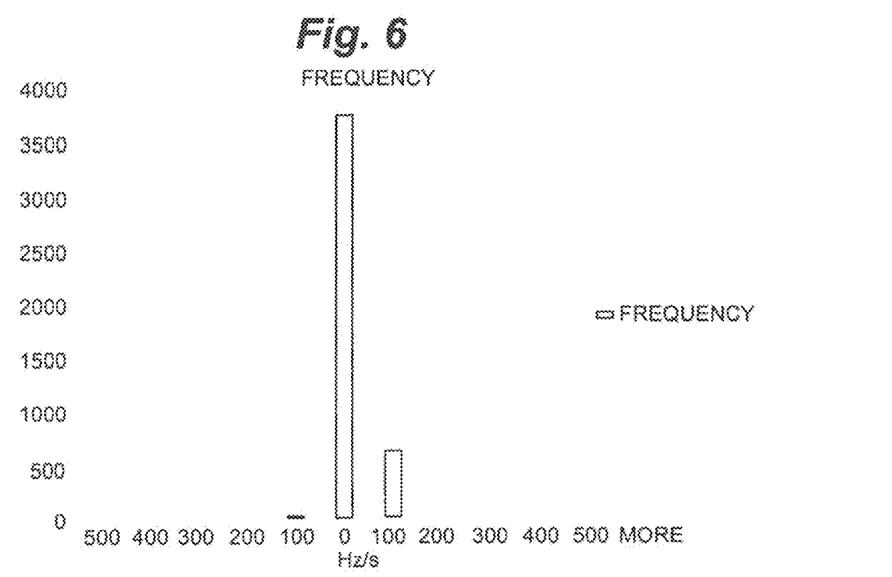
FIG. 6 is a histogram depiction of measured frequency change values in an islanded distributed generation system.

In FIG. 2, there is depicted an exemplary histogram of the absolute values of df/dt that would be expected for feeder 10 under grid-tied conditions. As depicted, most of the values are clustered near zero. Another peak is depicted at much higher |df/dt| values. This higher peak is caused by the way in which frequency is measured, and occurs because large load or another switching event on feeder 10 will cause transients in the frequency, and in |df/dt|, that are large in value but very short in duration. Thus, as depicted, when feeder 10 is under grid control, there will be primarily very fast (from switching) and slow (from the grid) frequency changes. Hence, under grid control, the distribution of |df/dt| is generally bimodal as depicted in FIG. 2. FIG. 5 depicts a histogram plot of measured frequency changes (Hz/s) over a given time window in one of the systems modeled in simulation as described hereinbelow, with the system in a grid-tied condition. As can be seen, the expected bimodal distribution is present.

Figure 3:
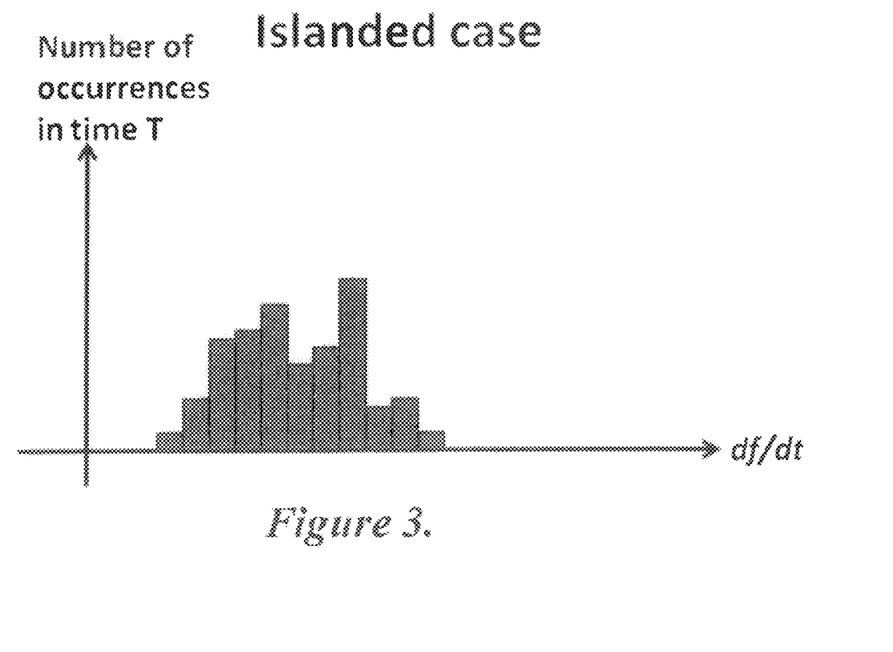
FIG. 3 is an exemplary histogram depiction of the expected distribution of the absolute value of df/dt in an islanded case.

In FIG. 3, there is depicted an exemplary histogram of |df/dt| as would be expected for feeder 10 under islanding conditions. With feeder 10 under control of distributed generators 26, 28, the frequency on feeder 10 is controlled by inverter phase locked loops or generator governors associated with generators 26, 28. The frequency changes resulting from these controls are much faster than the grid frequency changes associated with large generating equipment, but slower than the load switching transients also encountered when feeder 10 is grid-tied. As depicted in the histogram of FIG. 3, the mode of the distribution of |df/dt| becomes generally singular, and moves to a location between the two modes depicted in FIG. 2 when feeder 10 is under grid control. FIG. 5 depicts a histogram plot of measured frequency changes (Hz/s) over a given time window in one of the systems modeled in simulation as described hereinbelow, with the system in an islanded condition. As can be seen, the expected generally singular distribution is present.

According to embodiments of the invention, the differing distributions of |df/dt| depending on whether feeder 10 is grid-tied or is islanded can be used to detect an islanding condition. As depicted conceptually in FIG. 4, a coarsely divided histogram is used, wherein the x-axis is divided into three bins, defined by predetermined threshold values denoted ToB1 and ToB2. Bin 1 is defined near the zero value for |df/dt|, and is intended to encompass the slow frequency change events associated with a grid-tied condition, Bin 3 is intended to encompass the fast switching transients associated with a grid-tied condition, and Bin 2 which falls between the two is intended to encompass the islanding associated values of |df/dt|. Hence, the values of thresholds ToB1 and ToB2 are set such that the histogram groups depicted in FIG. 2 fall into either Bin 1 or Bin 3, and the histogram group depicted in FIG. 3 falls into Bin 2. The top value of Bin 3 is always ∞.

Figure 4:
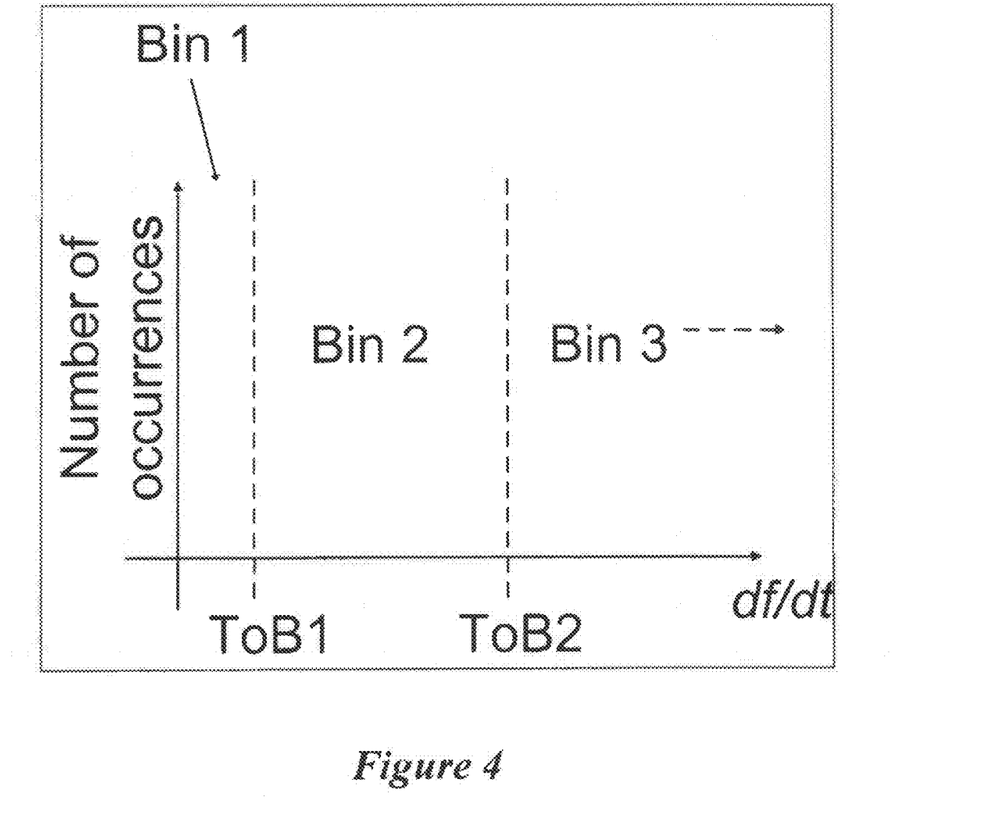
FIG. 4 is a depiction of a histogram for grouping measured df/dt values into bins according to an embodiment of the invention.

It will be appreciated that over any time period T, there will be determinable numbers of events that fall into each of Bin 1, Bin 2, and Bin 3. Using observed values for the respective numbers of these events over the time period T, a bimodality index BI can be computed as follows:

$$BI = \frac{\Sigma_{Bin2} X_i}{\Sigma_{Bin1} X_j + \Sigma_{Bin3} X_k}$$

where Bin1, Bin2, and Bin3 are the histogram bins with boundaries chosen to correspond to the low, middle and high groupings depicted in FIG. 4 and $X_j$, $X_i$, and $X_k$ are the elements of those bins respectively. In the grid tied condition, nearly all of the |df/dt| values should fall into Bin1 and Bin3, and BI≈0. After the island forms, there is more frequency "jitter" in the island because of the DER frequency controls, some, but not all, of the |df/dt| values move into Bin2, and B>0. For system-wide frequency events, many values will move into Bin2, and B>>0.

It will be appreciated that the threshold values ToB1 and ToB2 should be selected to maximize the probability that the desired "middle distribution" depicted in FIG. 3 falls within Bin 2. The inventor has determined baseline values, usable under most circumstances, for ToB1 and ToB2 of 3 milli-Hertz per second (mHz/s) and 8 mHz/s, respectively. Of course, it will be appreciated that these values may need to be adjusted, depending on the circumstances in individual applications. For example, to apply the method of the present invention to a system in a location where the grid may not be as "stiff" or "strong" as in the continental United States, such as on one of the Hawaiian islands, both ToB1 and ToB2 values would generally be increased. Also, it will be recognized that the values of ToB1 and ToB2 used will be dependent to some extent on the devices used to measure frequency, because of the filtering used in, and frequency responses of, these devices. For example, if a phasor measurement unit (PMU) is used, the method of the invention can still be used—the inventor has successfully tested the method using data from PMUs made by Schweitzer Engineering Laboratories—but ToB1 and ToB2 will depend on the frequency estimation technique used in the PMU. Some frequency measurement devices will be simply unsuitable for this technique because their frequency response is too slow to catch many of the events in Bin 2 or any event in Bin 3. Hence, it is important to ensure that the frequency measurement apparatus used at least has a fast enough response to capture events that would fall into Bin 3, such as switching transients.

Figure 7:
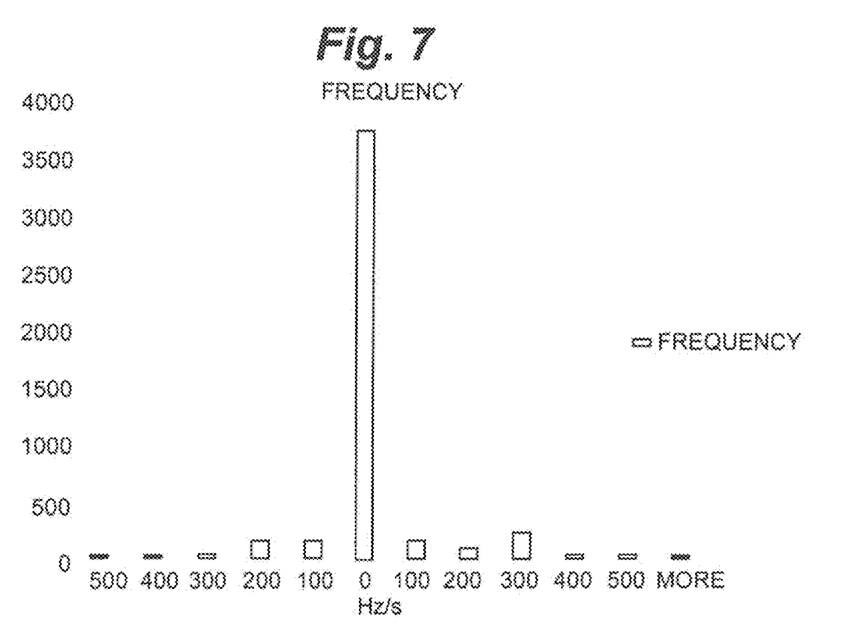
FIG. 7 is a histogram depiction of measured frequency change values in a grid-tied distributed generation system just after a large local switching event.

It will also be appreciated that it is important in an island detection method to balance detection effectiveness with some degree of false-trip immunity—accordingly, it is desirable to carefully select the decision criterion for determining whether a given result indicates the DERs should "ride-through," or an unintentional island case, in which the DERs should disconnect or enter a "micro-grid" mode. For example, a complicating factor can be the effect of large local switching events, such as a heavily-loaded large motor switched to the feeder. FIG. 7 depicts a histogram plot of measured frequency changes (Hz/s) just after such an event in one of the systems modeled in simulation as described hereinbelow, with the system in a grid-tied condition. As can be seen, a significant number histogram components that would fall into Bin 2 are present.

One preferred approach to address this is a technique developed by the inventor and called the "zero-time" method: over a given time window, the number of samples is determined for which BI=0, and the duration represented by those samples is summed and compared to the total window duration. For example, if a five-second window is chosen, and the total duration for which BI=0 is less than 1 second, an island would be indicated. These times (the five and 1 second times) can be adjusted to improve response speed, if the system's properties will permit this without a loss of selectivity. The inventor has found that an accurate indication of island formation for most systems is obtained when the value of BI is in the range of 0<BI<10 over more than 75% of a given window duration. Selectivity in some cases can be enhanced by using extremely high values of BI to suggest a system-wide event instead of an island and command a ride-through of the DERs. Another method is to use the average of BI over a shorter window, but this method is inferior in selectivity. Standard deviation of BI over a window (or standard deviation of df/dt directly) may also be used, but this may be significantly inferior in selectivity.

Table 1 below is a table presenting the results of exemplary simulations using the RoCoF-H method according to the invention and the "zero-time" criterion. Representative simulation results are reported on two feeders. The two feeders were: (1) the IEEE 34-bus distribution feeder, which is unusually long, mostly overhead, and high-impedance; and (2) a real-world feeder of medium stiffness (medium impedance) and serving a suburban region. Modeling was performed using EMTP-RV and MATLAB/Simulink, and in the case of the real-world feeders, using detailed observed feeder data supplied by the electric utility serving the feeders.

On each of the two feeders, four cases were simulated. The first two cases were chosen to represent difficult cases for island detection. Case A is a multiple-inverter case, in which many three-phase inverters were added to the feeder until a generation-load match could be achieved. As one example, the number of three-phase inverters added to the IEEE 34 bus system was 18. These inverters were spread along the feeder because the inductance between the inverters is believed to exacerbate the loss of anti-islanding effectiveness in the multi-inverter case. Phase-phase balancing was achieved by adding single-phase inverters to the more heavily loaded phases.

Case B was a case involving a mixture of types of DER. From an anti-islanding perspective, the most difficult combination of DERs arises when inverter-based DERs are combined with synchronous generators, so that is the case that was selected here. Some of the inverters in the multiple-inverter case were removed to make room for a single 1 MVA synchronous generator.

The latter two cases C and D do not involve islands, but instead are indicative of false-trip immunity (i.e., cases in which ride through is desired). Case C was a desired ride-through case simulating a loss of mainline generation resulting in a system-wide frequency event. In this case, it is highly desirable that the island detection method be able to distinguish this case from an unintentional islanded case and stay online to support the system. For this simulation, the frequency trajectory used was one measured during a major Italian blackout of 2003, scaled to 60 Hz. To implement this frequency trajectory, a programmable variable-frequency source was created in EMTP-RV and programmed to follow this trajectory based on a lookup table.

Case D is another ride-through case, this one involving a major local switching event such as mentioned above with respect to FIG. 7. Again, the anti-islanding system must be able to distinguish such an event from an island to avoid excessive false tripping. To simulate this event, a heavily-loaded 200-hp three-phase induction motor was switched directly across the line at a distal point on the feeder.

In each of the simulations, ToB1 was set to 3 mHz/sec, and ToB2 to 8 mHz/sec. The frequencies were measured by a phase-locked loop.

TABLE 1

| | Feeder | |
| --- | --- | --- |
| Test Case | IEEE 34 Bus Standard Feeder | Real-World Feeder |
| A | Island Detected | Island Detected |
| B | Island Detected | Island Detected |
| C | Successful Ride-Through | Successful Ride-Through |
| D | Successful Ride-Through | Successful Ride-Through |

As can be seen, the RoCoF-H method and "zero-time" criterion achieved the desired result in each of the simulated cases for both feeders.

In use, the RoCoF-H method is applied to a DER coupled to a grid-tied feeder by first determining the appropriate ToB1 and ToB2 values to be used with the system. Although the baseline values of 3 mHz/s and 8 mHz/s as discussed above are expected to be appropriate for use with most systems, it may be necessary to adjust these values to fit the individual characteristics of the feeder and the frequency control and monitoring equipment used with the DER. It may be necessary to conduct a system study in simulation and observe the histograms. The inventor has discovered that while it is usually possible to determine the grid-tied histogram simply through measurements, it is often not possible to obtain the islanded histogram experimentally.

Figure 8:
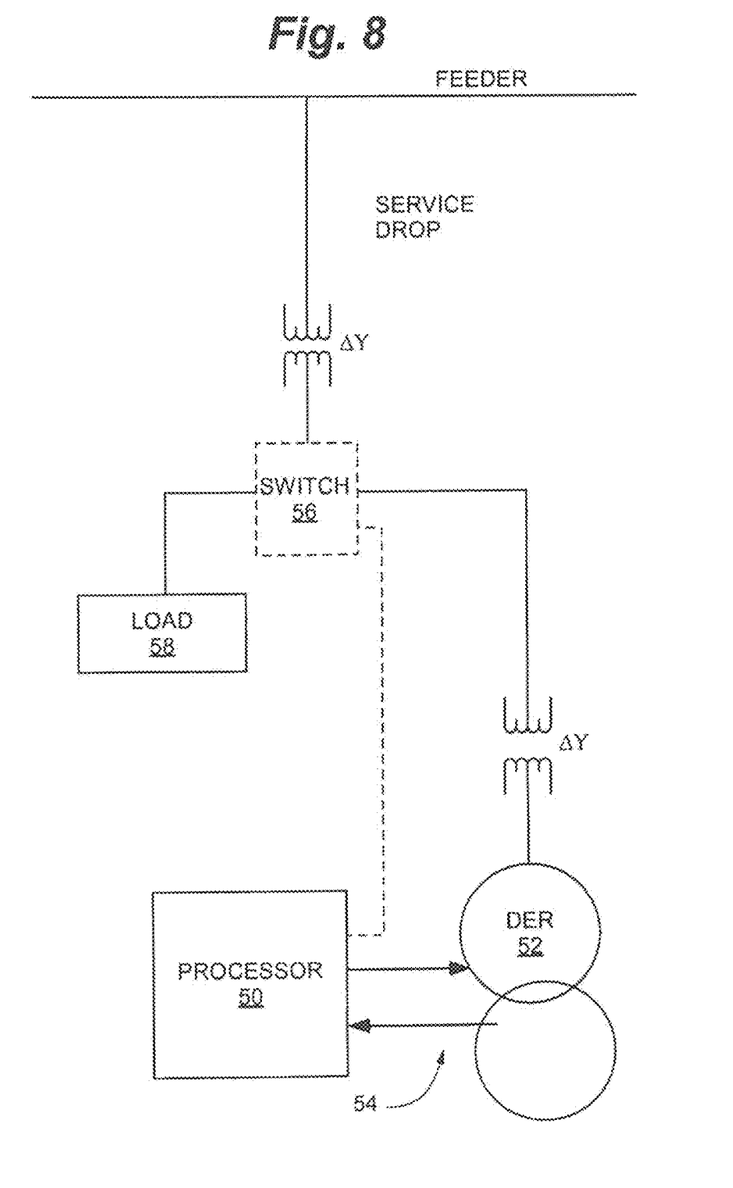
FIG. 8 is a block diagram of an anti-islanding control system for a DER according to an embodiment of the invention.

As depicted in block diagram form in FIG. 8, a processor 50 programmed with an algorithm for grouping real-time frequency data according to the histogram model of FIG. 4, with the predetermined ToB1 and ToB2 values, is communicatively coupled to the frequency measuring and control device of the DER 52 through communications link 54. The algorithm also includes appropriate decision criteria such as the "zero-time" criterion described above. The processor receives real-time frequency measurements, groups them into Bin 1, Bin 2 and Bin 3 of the histogram model over a time window, computes a bimodality index for the time window, and applies the decision criteria to determine whether an islanding condition exists. If an islanding condition is determined, processor 50 can command DER 52 to shut down or disconnect, or alternatively in appropriately equipped systems, can command a switch 56 to direct the DER generated power to a local load 58 so that the system can operate in a local "micro-grid" mode, serving only local load 58.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. §112(f) are not to be invoked unless the specific terms "means for" or "step for" are recited in a claim.

What is claimed is:

1. A method of detecting island formation in a distributed power system including at least one distributed generator interruptably coupled to a grid through a feeder, the method comprising:
   using a frequency measurement device to compile a set of values of the rate of change of frequency (RoCoF) in the power system at a plurality of instants in time, measured over a predetermined time window;
   using a processor to group the set of RoCoF values into a plurality of histogram bins, at least a first pattern of RoCoF values grouped into one of the histogram bins and representing an expected behavior of power frequency change when the feeder is grid-tied, and at least a second pattern of RoCoF values grouped into at least another one of the histogram bins and representing an expected behavior of power frequency change when the feeder is islanded;
   using the processor to apply a predetermined decision criterion to the histogram bins to determine whether the feeder is islanded or grid-tied; and
   automatically decoupling the distributed generator from the feeder if the feeder is determined to be islanded according to the predetermined decision criterion.

2. The method of claim 1, further comprising determining a first limit value of RoCoF defining a boundary between the first and second histogram bins.

3. The method of claim 1, wherein the plurality of histogram bins includes three bins, wherein the third one of the histogram bins represents another expected behavior of RoCoF values when the feeder is grid-tied.

4. The method of claim 3, further comprising determining a first limit value of RoCoF defining a boundary between the first and second bins, and determining a second limit value of RoCoF defining a boundary between the second and third bins.

5. The method of claim 3, further comprising computing a bimodality index for the grouped values.

6. The method of claim 5, wherein the bimodality index is used in the decision criterion.

7. The method of claim 6, wherein the decision criterion comprises determining whether the value of the bimodality index is in the range of between 0 and 10 over more than 75% of the time window.

8. An anti-islanding control apparatus for use in a distributed power system including at least one distributed generator interruptably coupled to a grid through a feeder, the apparatus comprising a processor communicatively coupled with a control system of the at least one distributed generator and programmed with an algorithm for:
   using a frequency measurement device to compile a set of values of the rate of change of frequency (RoCoF) in the power system at a plurality of instants in time, measured over a predetermined time window;
   using a processor to group the set of RoCoF values into a plurality of histogram bins, at least a first pattern of RoCoF values grouped into one of the histogram bins and representing an expected behavior of power frequency change when the feeder is grid-tied, and at least a second pattern of RoCoF values grouped into at least another one of the histogram bins and representing an expected behavior of power frequency change when the feeder is islanded;
   using the processor to apply a predetermined decision criterion to the histogram bins to determine whether the feeder is islanded or grid-tied; and automatically decoupling the distributed generator from the feeder if the feeder is determined to be islanded according to the predetermined decision criterion.

9. The apparatus of claim 8, wherein the algorithm further comprises determining a first limit value of RoCoF defining a boundary between the first and second histogram bins.

10. The apparatus of claim 8, wherein the plurality of histogram bins includes three bins, wherein the third one of the histogram bins represents another expected behavior of RoCoF values when the feeder is grid-tied.

11. The apparatus of claim 10, wherein the algorithm further comprises determining a first limit value of RoCoF defining a boundary between the first and second bins, and determining a second limit value of RoCoF defining a boundary between the second and third bins.

12. The apparatus of claim 10, wherein the algorithm further comprises computing a bimodality index for the grouped values.

13. The apparatus of claim 12, wherein the bimodality index is used in the decision criterion.

14. The apparatus of claim 13, wherein the decision criterion comprises determining whether the value of the bimodality index is in the range of between 0 and 10 over more than 75% of the time window.

15. An article comprising a machine-readable medium storing instructions operable to detect and correct island formation in a distributed power system, the power system including at least one distributed generator interruptably coupled to a grid through a feeder, the instructions for:

grouping a set of values of the rate of change of frequency (RoCoF) in the power system at a plurality of instants in time, measured over a predetermined time window, into a plurality of bins, at least a first one of the bins representing an expected behavior of RoCoF when the feeder is grid-tied, and at least a second one of the bins representing an expected behavior of RoCoF when the feeder is islanded;

applying a predetermined decision criterion to the grouped values to determine whether the feeder is islanded or grid-tied; and decoupling the distributed generator from the feeder if the feeder is determined to be islanded.

16. The article of claim 15, wherein the instructions further comprise determining a first limit value of RoCoF defining a boundary between the first and second bins.

17. The article of claim 15, wherein the plurality of bins includes three bins, wherein the third one of the bins represents another expected behavior of RoCoF when the feeder is grid-tied, and wherein the plurality of values of RoCoF in the power system are grouped into the three bins.

18. The article of claim 17, wherein the instructions further comprise determining a first limit value of RoCoF defining a boundary between the first and second bins, and determining a second limit value of RoCoF defining a boundary between the second and third bins.

19. The article of claim 17, wherein the instructions further comprise computing a bimodality index for the grouped values.

20. The article of claim 19, wherein the bimodality index is used in the decision criterion.

21. The article of claim 20, wherein the decision criterion comprises determining whether the value of the bimodality index is in the range of between 0 and 10 over more than 75% of the time window.

* * * * *